(12) United States Patent
Kim et al.

(10) Patent No.: US 11,942,573 B2
(45) Date of Patent: Mar. 26, 2024

(54) DEEP UV LIGHT EMITTING DIODE

(71) Applicant: SEOUL VIOSYS CO., LTD., Gyeonggi-do (KR)

(72) Inventors: Tae Gyun Kim, Gyeonggi-do (KR); Kyu Ho Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 450 days.

(21) Appl. No.: 17/344,691

(22) Filed: Jun. 10, 2021

(65) Prior Publication Data

US 2021/0305459 A1    Sep. 30, 2021

Related U.S. Application Data

(63) Continuation of application No. PCT/KR2019/017224, filed on Dec. 6, 2019.

(30) Foreign Application Priority Data

Jan. 14, 2019 (KR) .................. 10-2019-0004547

(51) Int. Cl.
*H01L 33/38* (2010.01)
*H01L 33/46* (2010.01)
*H01L 33/62* (2010.01)

(52) U.S. Cl.
CPC ............ *H01L 33/382* (2013.01); *H01L 33/46* (2013.01); *H01L 33/62* (2013.01)

(58) Field of Classification Search
CPC ............................. H01L 33/20; H01L 33/382
See application file for complete search history.

(56) References Cited

U.S. PATENT DOCUMENTS

| | | |
|---|---|---|
| 2016/0240759 A1 | 8/2016 | Chae et al. |
| 2018/0145224 A1 | 5/2018 | Kim et al. |
| 2019/0148596 A1* | 5/2019 | Park .................. H01L 33/00 257/99 |
| 2019/0198714 A1 | 6/2019 | Sato |

FOREIGN PATENT DOCUMENTS

| | | |
|---|---|---|
| KR | 1020120016424 | 2/2012 |
| KR | 1020150146204 | 12/2015 |
| KR | 1020160053138 | 5/2016 |

(Continued)

OTHER PUBLICATIONS

International Search Report for International Application PCT/KR2019/017224, dated Mar. 20, 2020.

(Continued)

*Primary Examiner* — Daniel P Shook
(74) *Attorney, Agent, or Firm* — LaBatt, LLC

(57) ABSTRACT

A deep UV light emitting diode includes a substrate, an n-type semiconductor layer located on the substrate, a mesa disposed on the n-type semiconductor layer, and including an active layer and a p-type semiconductor layer, an n-ohmic contact layer in contact with the n-type semiconductor layer, a p-ohmic contact layer in contact with the p-type semiconductor layer, an n-bump electrically connected to the n-ohmic contact layer, and a p-bump electrically connected to the p-ohmic contact layer. The mesa includes a plurality of vias exposing a first conductivity type semiconductor layer.

20 Claims, 4 Drawing Sheets

(56) References Cited

FOREIGN PATENT DOCUMENTS

| | | | |
|---|---|---|---|
| KR | 1020180008198 | 1/2018 | |
| WO | 2017034356 | 3/2017 | |
| WO | WO 2017/034356 A1 * | 3/2017 | ............ H01L 33/36 |
| WO | 2017122996 A1 | 7/2017 | |
| WO | 2018038105 A1 | 3/2018 | |

OTHER PUBLICATIONS

Extended European search report for European Application No. 19910067.8, dated Sep. 22, 2022, 12 pages.

* cited by examiner

DEEP UV LIGHT EMITTING DIODE

CROSS-REFERENCE OF RELATED APPLICATIONS AND PRIORITY

The Present Application is a continuation of International Application No. PCT/KR2019/017224, filed Dec. 6, 2019, which claims priority to Korean Patent Application No. 10-2019-0004547 filed Jan. 14, 2019, the disclosure of which are incorporated by reference in their entirety.

TECHNICAL FIELD

Exemplary embodiments relate to an inorganic semiconductor light emitting diode, and more particularly, to a light emitting diode emitting deep ultraviolet light of 300 nm or less.

BACKGROUND

Generally, a light emitting diode emitting ultraviolet light in a wavelength range of 200 nm to 300 nm can be used for various applications including sterilization devices, water or air purification devices, high density optical recording devices, excitation sources of bio-aerosol fluorescence detection systems.

Unlike a near-ultraviolet or blue light emitting diode, a light emitting diode emitting relatively deep ultraviolet light includes a well layer containing Al, such as AlGaN. Due to a composition of the gallium nitride based semiconductor layer, a deep UV light emitting diode has a structure significantly different from those of a blue light emitting diode and a near UV light emitting diode.

In particular, a conventional deep UV light emitting diode has a structure that a shape and a location of a mesa disposed on an n-type semiconductor layer are different from those of the general blue light emitting diode or the near UV light emitting diode. That is, the mesa is formed toward one side from a center of the n-type semiconductor layer, a p-bump is disposed on the mesa, and an n-bump is disposed near the other side opposite to the one side and spaced apart from the mesa.

The conventional UV light emitting diode generally has a drawback that a light output is low and a forward voltage is high. In particular, since a p-type GaN layer is included in a p-type semiconductor layer for an-ohmic contact, ultraviolet light incident into the p-type semiconductor layer is absorbed and lost in the p-type semiconductor layer. In addition, since an n-ohmic contact layer bonded to an n-type semiconductor layer also absorbs light, light traveling into the n-ohmic contact layer is absorbed and lost in the n-ohmic contact layer.

Furthermore, as it is difficult to use light emitted from a side surface of the mesa in the conventional UV light emitting diode, a size of the side surface of the mesa is set to be reduced as much as possible. That is, a width of the mesa is formed to be relatively wide. However, as the width of the mesa becomes larger, a distance from the n-ohmic contact layer to the central region of the mesa becomes farther, and thus, it is not favorable for current spreading, and a forward voltage becomes high.

SUMMARY

Exemplary embodiments provide a deep UV light emitting diode of a novel structure capable of improving electrical characteristics, and/or light output.

Exemplary embodiments provide a deep UV light emitting diode capable of improving current spreading performance.

A UV light emitting diode according to an exemplary embodiment includes a substrate, an n-type semiconductor layer located on the substrate, a mesa disposed on the n-type semiconductor layer, and including an active layer and a p-type semiconductor layer, an n-ohmic contact layer in contact with the n-type semiconductor layer; a p-ohmic contact layer in contact with the p-type semiconductor layer, an n-bump electrically connected to the n-ohmic contact layer, and a p-bump electrically connected to the p-ohmic contact layer, in which the mesa includes a plurality of vias exposing a first conductivity type semiconductor layer, the mesa has an elongated rectangular shape along a longitudinal direction, the vias are arranged parallel to one another in a direction perpendicular to the longitudinal direction of the mesa, and the n-ohmic contact layer is formed on the first conductivity type semiconductor layer exposed around the mesa and on the first conductivity type semiconductor layer exposed to the mesa, respectively.

A UV light emitting diode according to another exemplary embodiment includes a substrate, an n-type semiconductor layer located on the substrate, a mesa disposed on the n-type semiconductor layer, and including an active layer and a p-type semiconductor layer, n-ohmic contact layer in contact with the n-type semiconductor layer, and a p-ohmic contact layer in contact with the p-type semiconductor layer. The mesa includes a plurality of vias exposing a first conductivity type semiconductor layer. The mesa has an elongated rectangular shape along a longitudinal direction, the mesa has a mirror symmetrical structure with respect to a plane passing through a center of the mesa along the longitudinal direction of the mesa, and in addition, the mesa has a mirror symmetrical structure with respect to the plane passing through the center of the mesa along a direction perpendicular to the longitudinal direction of the mesa.

According to exemplary embodiments of the present disclosure, a large emission area may be secured through a mesa having a plurality of vias parallel to one another in a direction perpendicular to a longitudinal direction of the mesa, and since a mesa having a symmetrical structure is included, it is possible to provide a deep UV light emitting diode capable of evenly spreading current in the mesa.

The advantages and features of the present disclosure will be discussed in detail in a detailed description or become apparent through the detailed description.

DETAILED DESCRIPTION OF EMBODIMENTS

Figure 1:
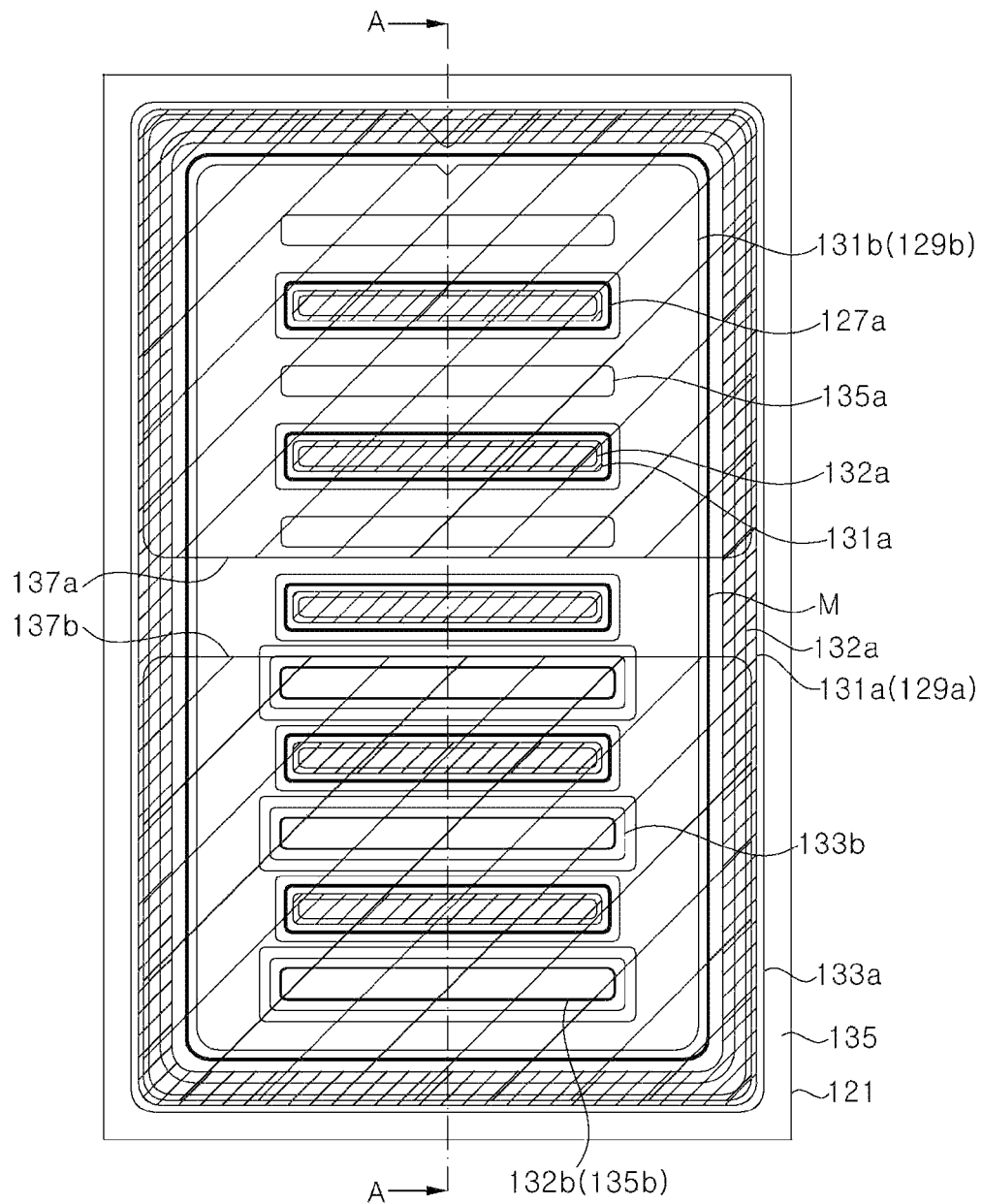
FIG. 1 is a plan view illustrating a deep UV light emitting diode according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

Nitride-based semiconductor layers described below may be grown by using various methods available in the art, for example, Metal Organic Chemical Vapor Deposition (MOCVD), Molecular Beam Epitaxy (MBE), Hydride Vapor Phase Epitaxy (HYPE), or the like. However, in exemplary embodiments described below, it is described that semiconductor layers are grown in a growth chamber using MOCVD. In growth processes of nitride-based semiconductor layers, generally known sources may be used for sources flowing into the growth chamber. For example, TMGa, TEGa, or the like may be used as a Ga source, TMAl, TEAl, or the like may be used as an Al source, TMIn, TEIn, or the like may be used as an In (Indium) source, and $NH_3$ may be used as an N source. However, the inventive concepts are not limited thereto.

A deep UV light emitting diode according to an exemplary embodiment includes a substrate, an n-type semiconductor layer located on the substrate, a mesa disposed on the n-type semiconductor layer, and including an active layer and a p-type semiconductor layer, an n-ohmic contact layer in contact with the n-type semiconductor layer, a p-ohmic contact layer in contact with the p-type semiconductor layer; an n-bump electrically connected to the n-ohmic contact layer, and a p-bump electrically connected to the p-ohmic contact layer, in which the mesa includes a plurality of vias exposing a first conductivity type semiconductor layer. The mesa has an elongated rectangular shape along a longitudinal direction, the vias are arranged parallel to one another in a direction perpendicular to the longitudinal direction of the mesa, and the n-ohmic contact layer are formed on the first conductivity type semiconductor layer exposed around the mesa and on the first conductivity type semiconductor layer exposed to the mesa, respectively.

In at least one variant, the plurality of vias is formed inside the mesa, and thus, it is possible to prevent a non-emission region from being formed inside the mesa. Conventionally, when a width of the mesa is wide, a distance from the n-ohmic contact layer to the inside of the mesa increases, thereby forming a non-emission area. On the contrary, in the present disclosure, the plurality of vias is disposed inside the mesa, and the n-ohmic contact layer is formed in the vias, and thus, current may be evenly spread inside the mesa.

Meanwhile, the plurality of vias may be spaced apart from one another at an identical interval. These intervals may be adjusted so that the non-emission region is not formed in the mesa between the vias.

Further, the mesa may have a mirror symmetrical structure with respect to a plane passing through a center of the mesa along the longitudinal direction of the mesa, and in addition, the mesa may have a mirror symmetrical structure with respect to the plane passing through the center of the mesa along the direction perpendicular to the longitudinal direction of the mesa.

Since the mesa has the symmetrical structure, it is possible to prevent current from being concentrated through a particular location of the mesa.

Meanwhile, the interval between the vias may be equal to or greater than the interval between one end of the via and one edge of the mesa. In addition, an interval between a short edge of the mesa and the via may be equal to or greater than the interval between the vias.

Meanwhile, the n-ohmic contact layer disposed on the first conductivity type semiconductor layer exposed around the mesa may surround the mesa. As such, current may be evenly spread over an entire region of the mesa.

Meanwhile, the deep UV light emitting diode may further include n-capping layers and a p-capping layer covering the n-ohmic contact layer and the p-ohmic contact layer, respectively, in which the capping layers may cover upper and side surfaces of the ohmic contact layers.

In at least one variant, the deep UV light emitting diode may further include a lower insulation layer covering the mesa, the n-ohmic contact layer, and the p-ohmic contact layer, and having openings located over the n-ohmic contact layer and the p-ohmic contact layer; an n-pad metal layer and a p-pad metal layer disposed on the lower insulation layer, and electrically connected to the n-ohmic contact layer and the p-ohmic contact layer through the openings of the lower insulation layer, respectively, and an upper insulation layer covering the n-pad metal layer and the p-pad metal layer. The n-bump and the p-bump may be disposed on the upper insulation layer, and electrically contact the n-pad metal layer and the p-pad metal layer through openings of the upper insulation layer.

Further, the n-pad metal layer may include a reflective metal layer, for example, an Al layer.

In addition, the n-pad metal layer may reflect light emitted through a side surface of the mesa. As such, light emitted through the side surface of the mesa and lost may be reduced, and thus, the light efficiency of the deep UV light emitting diode may be improved.

In another variant, the deep UV light emitting diode may further include n-capping layers and a p-capping layer covering the n-ohmic contact layer and the p-ohmic contact layer, respectively, in which the n-pad metal layer may be connected to the n-capping layers to be electrically connected to the n-ohmic contact layer.

Further, the n-capping layers may include a reflective metal layer, for example, an Al layer. As such, it is possible to reflect light emitted from the n-type semiconductor layer using the n-capping layer, and thus, the light efficiency of the deep UV light emitting diode may be improved.

In an exemplary embodiment, the n-pad metal layer may surround the p-pad metal layer. However, the inventive concepts are not necessarily limited thereto.

A deep UV light emitting diode according to another exemplary embodiment includes a substrate, an n-type semiconductor layer located on the substrate a mesa disposed on the n-type semiconductor layer, and including an active layer and a p-type semiconductor layer, an n-ohmic contact layer in contact with the n-type semiconductor layer, and a p-ohmic contact layer in contact with the p-type semiconductor layer, in which the mesa includes a plurality of vias exposing a first conductivity type semiconductor layer. The mesa has an elongated rectangular shape along a longitudinal direction, and the mesa has a mirror symmetrical structure with respect to a plane passing through a center of the mesa along the longitudinal direction of the mesa. In addition, the mesa has a mirror symmetrical structure with respect to the plane passing through the center of the mesa along a direction perpendicular to the longitudinal direction of the mesa.

Since the mesa has the symmetrical structure, it is possible to prevent current from being concentrated through a particular location of the mesa, and thus, the deep UV light emitting diode capable of evenly spreading current inside the mesa may be provided.

In at least one variant, the vias may have an elongated shape along the direction perpendicular to the longitudinal direction of the mesa, and may be arranged parallel to one another. The vias are formed in the elongated shape, and thus, current may be evenly spread not only in a region between the vias but also in a region between the via and an edge of the mesa.

Meanwhile, the n-ohmic contact layer includes a first type of an n-ohmic contact layer surrounding the mesa and a second type of two or more n-ohmic contact layers disposed in the vias.

Meanwhile, the deep UV light emitting diode may further include an n-pad metal layer electrically connected to the n-ohmic contact layer; and p-pad metal layers electrically connected to the p-ohmic contact layer, in which the n-pad metal layer may surround the p-pad metal layers.

In another variant, the n-pad metal layer and the p-pad metal layers may be formed through an identical process to be located at an identical level.

In further another variant, the deep UV light emitting diode may further include a lower insulation layer covering the mesa, the n-ohmic contact layer, and the p-ohmic contact layer, in which the n-pad metal layer and the p-pad metal layers may be disposed on the lower insulation layer, and may be electrically connected to the n-ohmic contact layer and the p-ohmic contact layer through openings formed in the lower insulation layer, respectively.

Further, the deep UV light emitting diode may further include an upper insulation layer covering the n-pad metal layer and the p-pad metal layers, and an n-bump and a p-bump disposed on the upper insulation layer, in which the n-bump may be electrically connected to the n-pad metal layer, and the p-bump may be electrically connected to the p-pad metal layers.

Hereinafter, exemplary embodiments of the present disclosure will be described in detail with reference to the drawings.

Figure 2:
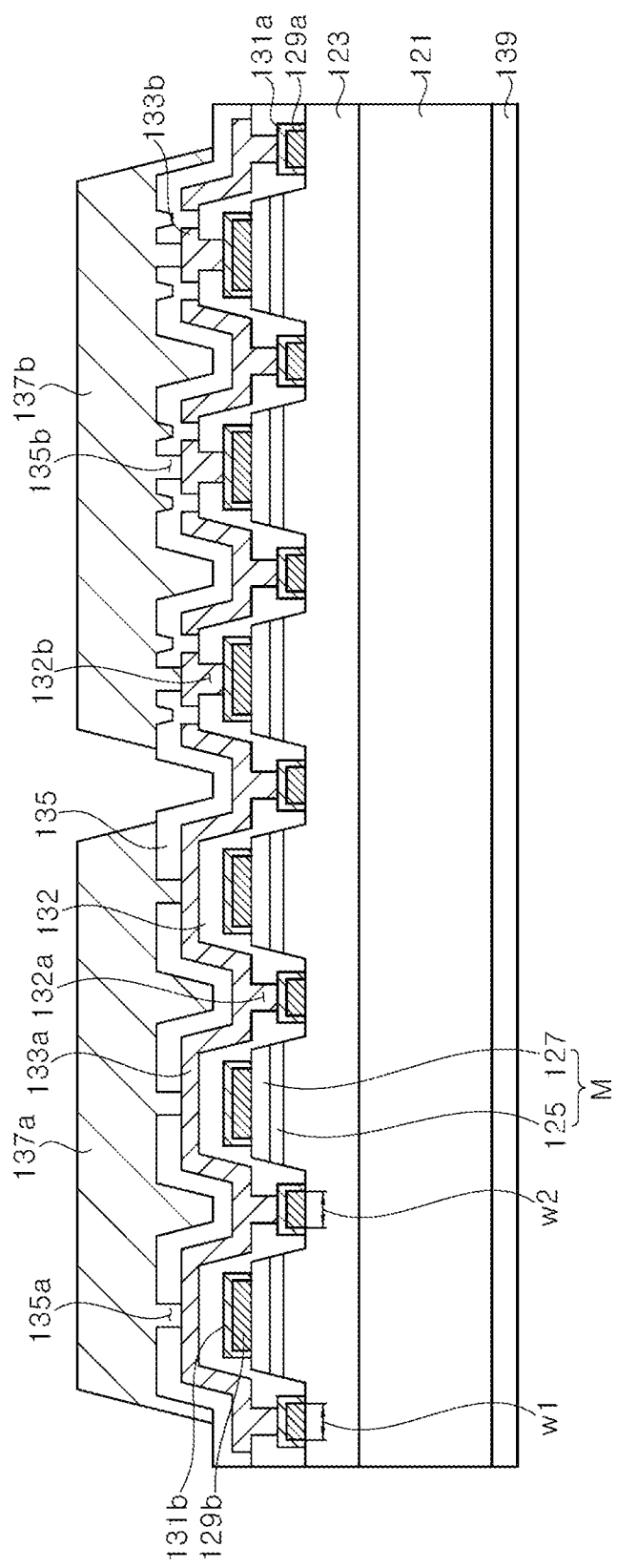
FIG. 2 is a cross-sectional view taken along line A-A of FIG. 1.

FIG. 1 is a schematic plan view illustrating a deep UV light emitting diode according to an exemplary embodiment, and FIG. 2 is a cross-sectional view taken along line A-A of FIG. 1. Meanwhile, FIG. 3 is a schematic plan view illustrating a mesa according to an exemplary embodiment.

Figure 3:
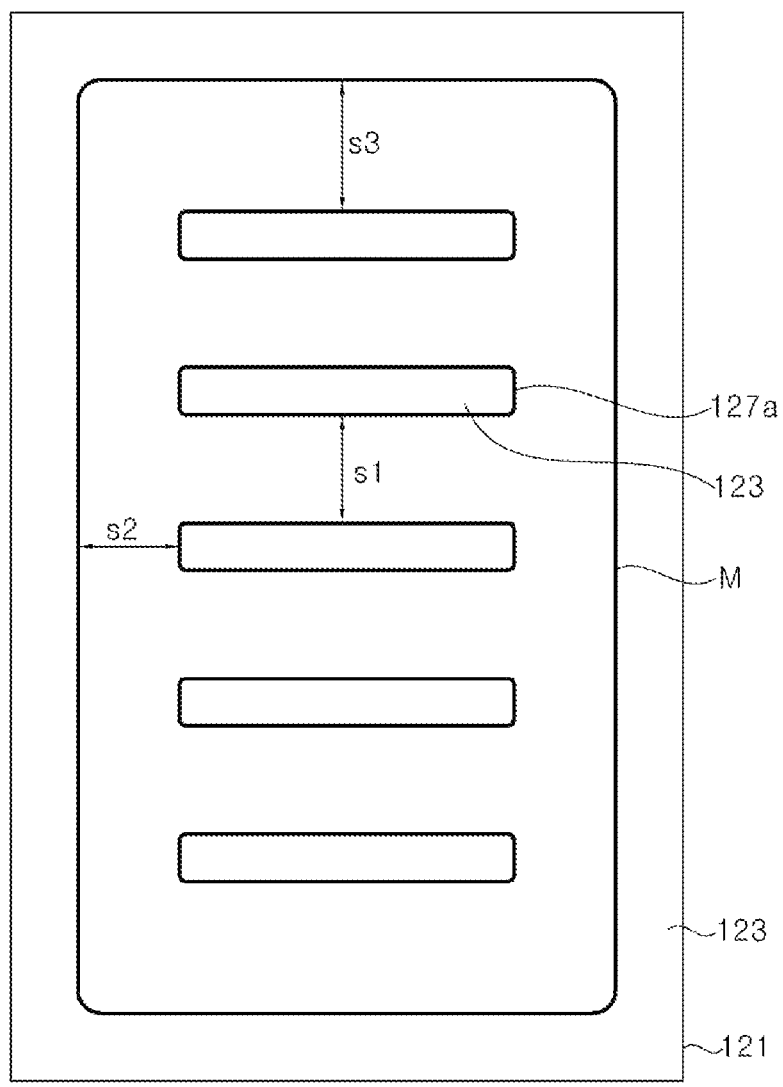
FIG. 3 is a schematic plan view illustrating a mesa according to an exemplary embodiment.

Referring to FIGS. 1, 2, and 3, the UV light emitting diode according to the exemplary embodiment may include a substrate 121, an n-type semiconductor layer 123, an active layer 125, a p-type semiconductor layer 127, an n-ohmic contact layer 129a, a p-ohmic contact layer 129b, an n-capping layer 131a, a p-capping layer 131b, a lower insulation layer 132, an n-pad metal layer 133a, a p-pad metal layer 133b, an upper insulation layer 135, an n-bump 137a and a p-bump 137b, and an anti-reflection layer 139.

The substrate 121 is not limited as long as it is a substrate capable of growing a nitride-based semiconductor, for example, and it may include a heterogeneous substrate such as a sapphire substrate, a silicon substrate, a silicon carbide substrate, a spinel substrate or the like, or it may include a homogeneous substrate such as a gallium nitride substrate, an aluminum nitride substrate, or the like.

The n-type semiconductor layer 123 is disposed on the substrate 121. The n-type semiconductor layer 123 may include, for example, an AlN buffer layer (about 3.79 μm) and an n-type AlGaN layer. The n-type AlGaN layer may include a lower n-type AlGaN layer (about 2.15 μm) having a mole ratio of Al of 0.8 or more, an intermediate AlGaN layer (1.7 nm) having an Al mole ratio of 0.7 to 0.8, and an upper n-type AlGaN layer having a thickness of 66.5 nm. The n-type semiconductor layer 123 is formed of a nitride-based semiconductor having a band gap wider than that of an active layer so as to transmit light generated in the active layer. In a case where a gallium nitride based semiconductor layer is grown on a sapphire substrate 121, the n type semiconductor layer 123 may usually include a plurality of layers so as to improve crystalline quality.

The mesa M is disposed on a partial region of the n-type semiconductor layer 123. The mesa M includes the active layer 125 and the p-type semiconductor layer 127. In general, after the n-type semiconductor layer 123, the active layer 125, and the p-type semiconductor layer 127 are sequentially grown, the mesa M is formed by patterning the p-type semiconductor layer 127 and the active layer 125 through a mesa etching process.

The active layer 125 may be a single quantum well structure or a multiple quantum well structure including well layers and barrier layers. The well layers may be formed of AlGaN or AlInGaN, and the barrier layers may be formed of AlGaN or AlInGaN having a wider band gap than that of the well layer. For example, each well layer may be formed of AlGaN having a mole ratio of Al of about 0.5 with a thickness of about 3.1 nm, and each barrier layer may be formed of AlGaN having a mole ratio of Al of 0.7 or more with a thickness of about 9 nm or more. In particular, a first barrier layer may be formed thicker than the remaining barrier layers with a thickness of about 12 nm or more. Meanwhile, AlGaN layers having an Al mole ratio of 0.7 to 0.8 may be disposed in contact with upper and lower portions of each well layer with a thickness of about 1 nm, respectively. However, an Al mole ratio of the AlGaN layer contacting a last well layer may be 0.8 or more in consideration of contacting an electron blocking layer.

Meanwhile, the p-type semiconductor layer 127 may include an electron blocking layer and a p-type GaN contact layer. The electron blocking layer prevents electrons from overflowing from the active layer to the p-type semiconductor layer, and thus, recombination rate of electrons and holes is improved. The electron blocking layer may be formed of, for example, p-type AlGaN having a mole ratio of Al of about 0.8, and may be formed with a thickness of, for example, 55 nm. Meanwhile, the p-type GaN contact layer may be formed to have a thickness of about 300 nm.

As illustrated in FIG. 3, the mesa M may have an elongated rectangular shape in one direction, and includes a plurality of vias 127a exposing the n-type semiconductor layer 123. Each of the vias 127a may have an elongated shape, and may be disposed in a direction perpendicular to a longitudinal direction of the mesa M. The vias 127a may be spaced apart from one another and arranged in parallel, and further, the vias 127a may be spaced apart from one another at an identical interval s1. Meanwhile, an interval s2 between one end of the via 127a in the longitudinal direction and an edge of the mesa M adjacent thereto may be equal to or less than the interval s1 between the vias 127a. In addition, an interval s3 between a short edge of the mesa M and the via 127a adjacent thereto may be equal to or greater than the interval s1 between the vias 127a.

Furthermore, the mesa M may have a mirror symmetrical structure with respect to a plane crossing a center of the mesa along the longitudinal direction of the mesa, and in addition, may also have a mirror symmetrical structure with respect to the plane crossing the center of the mesa along a direction perpendicular to the longitudinal direction of the mesa. With this shape, the current may be evenly spread in the mesa M.

Referring back to FIGS. 1 and 2, the n-ohmic contact layers 129a are disposed on the n-type semiconductor layer 123 exposed around the mesa M and exposed to the vias 127a. After a plurality of metal layers is deposited, the n-ohmic contact layers 129a may be formed by alloying these metal layers through a rapid thermal alloy (RTA) process. For example, the n-ohmic contact layer 129a may be formed by after sequentially depositing Cr/Ti/Al/Ti/Au, and alloying these metal layers through the RTA process. As such, the n-ohmic contact layer 129a becomes an alloy layer containing Cr, Ti, Al, and Au.

An n-ohmic contact layer 129a surrounds the mesa M along a periphery of the mesa M. In addition, the n-ohmic contact layers 129a are disposed in the vias 127a. A width w1 of the n-ohmic contact layer 129a surrounding the mesa M along the periphery of the mesa M may be smaller than a width w2 of the n-ohmic contact layer 129a disposed in the via 127a. Since the width w2 of the n-ohmic contact layer 129a disposed in the via 127a is set to be larger than the width w1 of the n-ohmic contact layer around the mesa, current may be easily supplied into the mesa M. The width w1 may be in a range of about 5 µm to 30 µm, for example, and the width w2 may be in a range of about 10 µm to 40 µm.

The n-ohmic contact layers 129a are spaced apart from the mesa M at a predetermined interval. Accordingly, a region without the n-ohmic contact layer 129a is formed between the mesa M and the n-ohmic contact layer 129a. A separation distance between the n-ohmic contact layer 129a and the mesa M may be constant along the periphery of the mesa M, but the inventive concepts are not necessarily limited thereto.

After the n-ohmic contact layers 129a are formed, the p-ohmic contact layer 129b is formed on the mesa M. The p-ohmic contact layer 129b may be formed through the RTA process after depositing Ni/Au, for example. The p-ohmic contact layer 129b is in ohmic contact with the p-type semiconductor layer 127 and covers most of, for example, 80% or more of an upper region of the mesa M.

The n-capping layers 131a and the p-capping layer 131b may be formed on the n-ohmic contact layers 129a and the p-ohmic contact layer 129b, respectively. The n and p-capping layers 131a and 131b may cover upper and side surfaces of the n-ohmic contact layers 129a and the p-ohmic contact layer 129b. These capping layers 131a and 131b may include a reflective metal layer, for example, an Al layer, and specifically, may be formed of Cr/Al/Ti/Ni/Ti/Ni/Ti/Ni/Au/Ti. In particular, the n-capping layer 131a may have a larger width than that of the n-ohmic contact layer 129a, and thus, may function as a reflection layer (first reflection layer) that reflects light emitted through the n-type semiconductor layer 123. Further, the n-capping layer 131a may have an elevation lower than that of the mesa M, and thus, an upper surface of the n-capping layer 131a may be located below an upper surface of the mesa M.

The lower insulation layer 132 covers the mesa M, and in addition, covers the n-capping layers 131a and the p-capping layer 131b. The lower insulation layer 132 also covers the n-type semiconductor layer 123 exposed around the mesa M and exposed in the vias 127a. Meanwhile, the lower insulation layer 132 has openings 132a for allowing electrical connection to the n-ohmic contact layers 129a and openings 132b for allowing electrical connection to the p-ohmic contact layer 129b. The openings 132a and 132b exposing the capping layers 131a and 131b may be formed by etching the lower insulation layer 132. In this case, a Ti layer on upper surfaces of the exposed capping layers 131a and 131b may be removed by the etching process.

The lower insulation layer 132 may be formed of, for example, $SiO_2$, but the inventive concepts are not limited thereto, and may be formed of a distributed Bragg reflector.

Meanwhile, the n-pad metal layer 133a and the p-pad metal layer 133b are disposed on the lower insulation layer 132. The n-pad metal layer 133a and the p-pad metal layer 133b may be formed together using an identical metal layer in an identical process and may be disposed on an identical level, that is, on the lower insulation layer 132. The n and p-pad metal layers 133a and 133b may include a reflective metal layer, for example, an Al layer so as to have high reflectivity. For example, the n-pad and p-pad metal layers 133a and 133b may have an identical layer structure as that of the capping layers 131a and 131b.

The n-pad metal layer 133a is electrically connected to the n-ohmic contact layers 129a through the openings 132a of the lower insulation layer 132. The n-ohmic contact layers 129a are electrically connected to one another by the n-pad metal layer 133a. The n-pad metal layer 133a may extend to the upper region of the mesa M from the n-ohmic contact layers 129a located below the mesa M.

The p-pad metal layers 133b may be electrically connected to the p-ohmic contact layer 129b through the openings 132b of the lower insulation layer 132, respectively. The p-pad metal layers 133b are spaced apart from one another, and may be surrounded by the n-pad metal layer 133a, respectively.

The n-pad metal layer 133a may function as a reflection layer (second reflection layer) that reflects light emitted through a side surface of the mesa M, thereby improving the light efficiency of the light emitting diode. In addition, the n-capping layers 131a and the n-pad metal layer 133a may reflect light emitted from the n-type semiconductor layer 123 exposed in a region between the mesa M and the n-ohmic contact layers 129a.

The upper insulation layer 135 covers the n-pad metal layer 133a and the p-pad metal layers 133b. However, the upper insulation layer 135 has openings 135a exposing the n-pad metal layer 133a and openings 135b exposing the p-pad metal layers 133b in the upper region of the mesa M. The opening 135a may be formed to have an elongated shape along the via 127a. As shown in FIGS. 1 and 3, the openings 135a may be disposed above a line passing through the center of the mesa along a short axis direction of the mesa M. Meanwhile, the openings 135b may be disposed below the line passing through the center of the mesa along the short axis direction of the mesa M. The upper insulation layer 135 may be formed of, for example, silicon nitride or silicon oxide.

The n-bumps 137a and p-bumps 137b are located on the upper insulation layer 135. The n-bump 137a covers the opening 135a and is connected to the n-pad metal layer 133a through the opening 135a. The n-bump 137a is electrically connected to the n-type semiconductor layer 123 through the n-pad metal layer 133a and the n-ohmic contact layers 129a. Outer edges of the n-bumps 137a and p-bumps 137b may be located on the n-ohmic contact layer 129a surrounding the mesa M.

The p-bump 137b covers the openings 135b and is connected to the p-pad metal layers 133b through the openings 135b. The p-bump 137b is electrically connected to the p-type semiconductor layer 127 through the p-pad metal layers 133b and the p-ohmic contact layer 129b. The p-pad metal layers 133b may be electrically connected to one another through the p-bump 137b.

The n-bumps 137a and p-bumps 137b may be formed of, for example, Ti/Au/Cr/Au. As shown in FIG. 1, the n-bumps 137a and the p-bumps 137b may be disposed along the longitudinal direction of the mesa M. The n-bumps 137a and the p-bumps 137b may be spaced apart by about 90 μm. Since an interval between the n-bumps 137a and the p-bumps 137b is set to be narrow, areas of the n-bumps 137a and the p-bumps 137b may be relatively widened. As such, it is possible to easily dissipate heat generated in the light emitting diode, and thus, performance of the light emitting diode may be improved.

Further, the openings 135a and 135b are covered with the n-bumps 137a and the p-bumps 137b, and thus, moisture or solder from the outside may be prevented from penetrating through the openings 135a and 135b, thereby improving reliability of the light emitting diode.

Meanwhile, as shown in FIG. 2, upper surfaces of the n-bumps 137a and p-bumps 137b may not be flat due to a difference in elevation between the mesa M and the n-pad metal layer 133a.

The anti-reflection layer 139 is disposed on a light exiting surface of the substrate 121. The anti-reflection layer 139 may be formed of a transparent insulation layer such as $SiO_2$ with a thickness of an integer multiple of ¼ of an ultraviolet wavelength, for example. Alternatively, as the anti-reflection layer 139, a bandpass filter in which layers having different refractive indices from one another are repeatedly stacked may be used.

Figure 4:
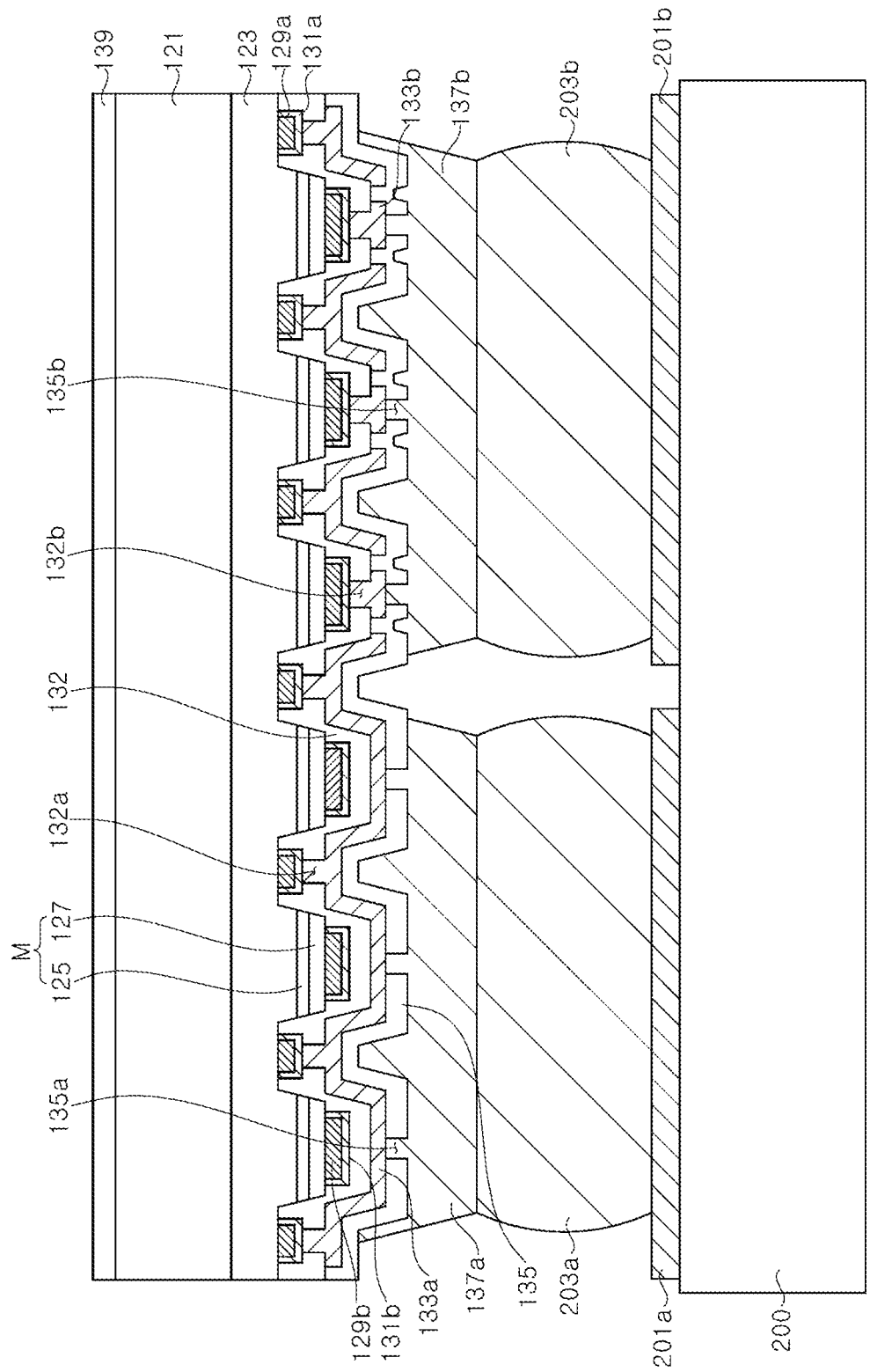
FIG. 4 is a schematic cross-sectional view illustrating a deep UV light emitting diode mounted on a sub-mount according to an exemplary embodiment.

FIG. 4 is a schematic cross-sectional view illustrating a deep UV light emitting diode mounted on a sub-mount according to an exemplary embodiment.

Referring to FIG. 4, the deep UV light emitting diode is flip-bonded on a sub-mount substrate 200. The sub-mount substrate 200 may have electrode pads 201a and 201b on an insulating substrate such as AlN.

N-bumps 137a and p-bumps 137b may be bonded to the electrode pads 201a and 201b of the sub-mount substrate 200 through solder pastes 203a and 203b. However, the inventive concepts are not limited thereto, and the deep UV light emitting diode may be bonded to the sub-mount substrate 200 using thermal ultrasonic bonding technology or solder bonding using AuSN.

Various modifications and changes can be made in the exemplary embodiments described herein without departing from the technical spirit according to the appended claims of the present disclosure, and the present disclosure comprises all the technical ideas according to the appended claims.

What is claimed is:

1. A deep UV light emitting diode, comprising:
    a substrate;
    an n-type semiconductor layer located on the substrate;
    a mesa disposed on the n-type semiconductor layer, and including an active layer and a p-type semiconductor layer;
    an n-ohmic contact layer in contact with the n-type semiconductor layer;
    a p-ohmic contact layer in contact with the p-type semiconductor layer;
    an n-bump electrically connected to the n-ohmic contact layer; and
    a p-bump electrically connected to the p-ohmic contact layer, wherein:
        the mesa includes a plurality of vias exposing the n-type semiconductor layer,
        the mesa has an elongated rectangular shape along a longitudinal direction,
        the vias are arranged parallel to one another in a direction perpendicular to the longitudinal direction, and
        the n-ohmic contact layer is formed on the n-type semiconductor layer exposed around the mesa and on the n-type semiconductor layer disposed in the vias, respectively.

2. The deep UV light emitting diode of claim 1, wherein the plurality of vias is spaced apart from one another at an identical interval.

3. The deep UV light emitting diode of claim 1, wherein the mesa has a mirror symmetrical structure: with respect to a first plane passing through a center of the mesa along the longitudinal direction of the mesa, and with respect to a second plane passing through a center of the mesa along a direction perpendicular to the longitudinal direction.

4. The deep UV light emitting diode of claim 1, wherein an interval between the vias is equal to or greater than a distance between a first edge of the mesa and one end of a via disposed adjacent to the first edge of the mesa in the longitudinal direction.

5. The deep UV light emitting diode of claim 1, wherein a distance between a second edge of the mesa and one end of another via disposed adjacent to the second edge of the mesa is equal to or greater than the interval between the vias in the direction perpendicular to the longitudinal direction, wherein the second edge is shorter than the first edge.

6. The deep UV light emitting diode of claim 1, wherein the n-ohmic contact layer, disposed on the n-type semiconductor layer which is exposed around the mesa, surrounds the mesa.

7. The deep UV light emitting diode of claim 1, further comprising:
    n-capping layers and a p-capping layer covering the n-ohmic contact layer and the p-ohmic contact layer, respectively,
    wherein the n-capping layers cover upper and side surfaces of the n-ohmic contact layer, and the p-capping layer covers upper and side surfaces of the p-ohmic contact layer.

8. The deep UV light emitting diode of claim 1, further comprising:
    a lower insulation layer covering the mesa, the n-ohmic contact layer, and the p-ohmic contact layer, and having openings located over the n-ohmic contact layer and the p-ohmic contact layer;
    an n-pad metal layer and a p-pad metal layer disposed on the lower insulation layer, and electrically connected to the n-ohmic contact layer and the p-ohmic contact layer through the openings of the lower insulation layer, respectively; and
    an upper insulation layer covering the n-pad metal layer and the p-pad metal layer,
    wherein the n-bump and the p-bump are disposed on the upper insulation layer, and electrically contact the n-pad metal layer and the p-pad metal layer, respectively, through openings of the upper insulation layer.

9. The deep UV light emitting diode of claim 8, wherein the n-pad metal layer includes an Al layer.

10. The deep UV light emitting diode of claim 8, wherein the n-pad metal layer reflects light emitted through a side surface of the mesa.

11. The deep UV light emitting diode of claim 8, further comprising:
n-capping layers and a p-capping layer covering the n-ohmic contact layer and the p-ohmic contact layer, respectively,
wherein the n-pad metal layer is connected to the n-capping layers to be electrically connected to the n-ohmic contact layer.

12. The deep UV light emitting diode of claim 11, wherein:
the n-capping layers include an Al layer, and the n-pad metal layer surrounds the p-pad metal layer.

13. A deep UV light emitting diode, comprising:
a substrate;
an n-type semiconductor layer located on the substrate;
a mesa disposed on the n-type semiconductor layer, and including an active layer and a p-type semiconductor layer;
an n-ohmic contact layer in contact with the n-type semiconductor layer; and
a p-ohmic contact layer in contact with the p-type semiconductor layer, wherein:
the mesa includes a plurality of vias exposing the n-type semiconductor layer,
the mesa has an elongated rectangular shape along a longitudinal direction,
the mesa has a mirror symmetrical structure with respect to a first plane passing through a center of the mesa along the longitudinal direction of the mesa, and with respect to a second plane passing through the center of the mesa along a direction perpendicular to the longitudinal direction of the mesa.

14. The deep UV light emitting diode of claim 13, wherein the vias have an elongated shape along the direction perpendicular to the longitudinal direction, and are arranged parallel to one another.

15. The deep UV light emitting diode of claim 13, wherein the n-ohmic contact layer includes a first type of an n-ohmic contact layer surrounding the mesa and a second type of two or more n-ohmic contact layers disposed in the vias.

16. The deep UV light emitting diode of claim 13, further comprising:
an n-pad metal layer electrically connected to the n-ohmic contact layer; and
p-pad metal layers electrically connected to the p-ohmic contact layer,
wherein the n-pad metal layer surrounds the p-pad metal layers, and
the n-pad metal layer and the p-pad metal layers are positioned at an identical level.

17. The deep UV light emitting diode of claim 16, further comprising:
a lower insulation layer covering the mesa, the n-ohmic contact layer, and the p-ohmic contact layer,
wherein the n-pad metal layer and the p-pad metal layers are disposed on the lower insulation layer, and electrically connected to the n-ohmic contact layer and the p-ohmic contact layer through openings formed in the lower insulation layer, respectively.

18. The deep UV light emitting diode of claim 16, further comprising:
an upper insulation layer covering the n-pad metal layer and the p-pad metal layers; and
an n-bump and a p-bump disposed on the upper insulation layer,
wherein the n-bump is electrically connected to the n-pad metal layer, and the p-bump is electrically connected to the p-pad metal layers.

19. A deep UV light emitting diode, comprising:
a substrate;
an n-type semiconductor layer located on the substrate;
a mesa disposed on the n-type semiconductor layer, including an active layer and a p-type semiconductor layer, and including a plurality of vias exposing the n-type semiconductor layer;
an n-ohmic contact layer contacting the n-type semiconductor layer exposed around the mesa and the n-type semiconductor layer exposed to the plurality of vias, respectively;
first reflection layers covering upper and side surfaces of the n-ohmic contact layer and located lower than the mesa;
a second reflection layer connected to the first reflection layers and extending to an upper region of the mesa from the first reflection layers;
an n-bump connected to the second reflection layer; and
a p-bump electrically connected to the p-type semiconductor layer, wherein the n-ohmic contact layer, the first reflection layers, and the second reflection layer include Al.

20. The deep UV light emitting diode of claim 19, wherein a width of the n-ohmic contact layer contacting the n-type semiconductor layer around the mesa is narrower than a width of the n-ohmic contact layer contacting the n-type semiconductor layer in each via.

* * * * *